US006413846B1

United States Patent
Besser et al.

(10) Patent No.: US 6,413,846 B1
(45) Date of Patent: Jul. 2, 2002

(54) CONTACT EACH METHODOLOGY AND INTEGRATION SCHEME

(75) Inventors: Paul R. Besser; Errol Todd Ryan; Frederick N. Hause; Frank Mauersberger; William S. Brennan; John A. Iacoponi; Peter J. Beckage, all of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/712,501

(22) Filed: Nov. 14, 2000

(51) Int. Cl.[7] .............................................. H01L 21/44
(52) U.S. Cl. ...................... 438/597; 438/634; 438/629; 438/970
(58) Field of Search ................................ 438/105, 629, 438/626, 633, 634, 645, 970, 597

(56) References Cited

U.S. PATENT DOCUMENTS

| 5,571,751 | A | * | 11/1996 | Chung ........................ 437/187 |
| 5,573,633 | A | * | 11/1996 | Gambino et al. ........ 156/636.1 |
| 5,953,635 | A | * | 9/1999 | Andideh ..................... 438/761 |
| 6,080,656 | A | * | 6/2000 | Shih et al. .................. 438/626 |
| 6,159,845 | A | * | 12/2000 | Yew et al. ................... 438/637 |
| 6,162,737 | A | * | 12/2000 | Weimer et al. ............. 438/738 |
| 6,200,901 | B1 | * | 3/2001 | Hudson et al. ............. 438/697 |
| 6,225,214 | B1 | * | 5/2001 | Lin ............................. 438/629 |
| 6,268,281 | B1 | * | 7/2001 | Shih et al. .................. 438/629 |

OTHER PUBLICATIONS

Applied Materials, "Applied Materials Announces Breakthrough Low K Dielectric Film For High–Speed Copper Chips".*

* cited by examiner

Primary Examiner—John F. Niebling
Assistant Examiner—Angel Roman
(74) Attorney, Agent, or Firm—Williams, Morgan & Amerson, P.C.

(57) ABSTRACT

A method of forming conductive contacts or an integrated circuit device is disclosed herein. In one embodiment, the method comprises forming a transistor above a semiconducting substrate, and forming a first layer comprised of an orthosilicate glass material above the transistor and the substrate. The method further comprises forming a second layer comprised of an insulating material above the first layer, and performing at least one etching process to define an opening in the second layer for a conductive contact to be formed therein, wherein the first layer comprised of an orthosilicate glass material acts as an etch stop layer during the etching of the opening in the second layer.

36 Claims, 6 Drawing Sheets

CONTACT EACH METHODOLOGY AND INTEGRATION SCHEME

BACKGROUND OF THE INVENTION

1. Field of the Invention

The present invention is generally directed to the field of semiconductor manufacturing, and, more particularly, to a method of forming an opening in an insulating layer where a conductive contact will be formed.

2. Description of the Related Art

There is a constant drive to reduce the size, or scale, of transistors to increase the overall speed of the transistor, as well as integrated circuit devices incorporating such transistors. A conventional integrated circuit device, such as a microprocessor, is typically comprised of millions of transistors formed above the surface of a semiconducting substrate. For the integrated circuit device to function, the transistors must be electrically connected to one another through conductive interconnections, i.e., conductive lines and plugs.

Many modern integrated circuit devices are very densely packed, i.e., there is very little space between the transistors formed above the substrate. Thus, these conductive interconnections are made in multiple layers to conserve plot space on the semiconducting substrate. This is typically accomplished through the formation of alternating layers of conductive lines and conductive plugs formed in layers of insulating materials formed on the device. As is readily apparent to those skilled in the art, the conductive plugs are means by which various layers of conductive lines, and/or semiconductor devices, may be electrically coupled to one another. In the industry, conductive plugs that are in contact with portions of the underlying integrated circuit device, e.g., the source/drain regions of a transistor, are known as "contacts". Conductive plugs that connect conductive lines are known as "vias". The conductive lines and plugs may be made from a variety of conductive materials, such as copper, aluminum, aluminum alloys, titanium, tantalum, titanium nitride, tantalum nitride, tungsten, etc.

Figure 1A:
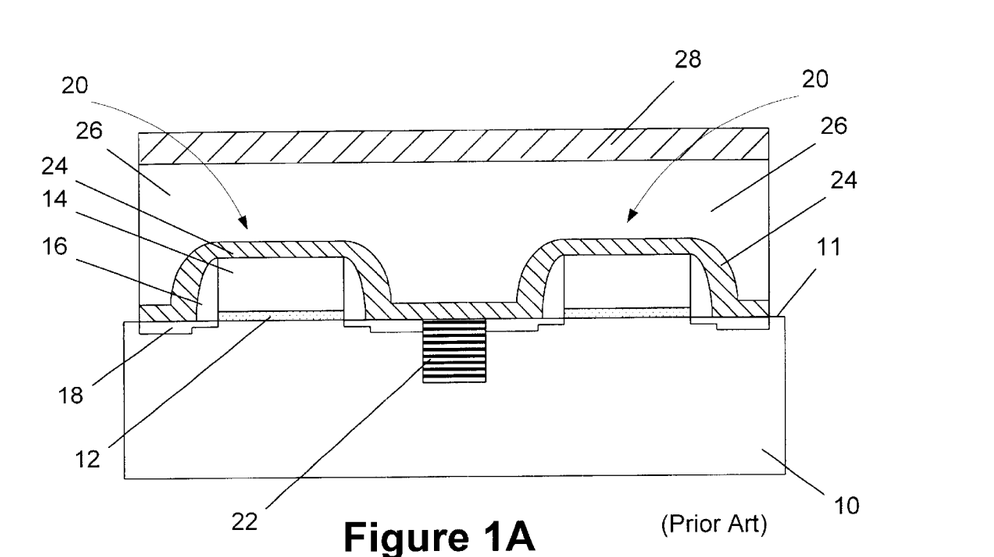
FIGS. 1A–1B depict an illustrative process flow for forming an opening in an insulating layer where a conductive contact will be formed.

A typical prior art process flow for forming an illustrative conductive contact will now be described. As shown in FIG. 1A, a plurality of transistors 20, separated by a trench isolation region 22, are formed above a semiconducting substrate 10. Each transistor 20 is comprised of a gate insulation layer 12, a gate electrode 14, a sidewall spacer 16, and a plurality of source/drain regions 18. The transistors 20 may be comprised of a variety of known materials, and they may be fabricated using a variety of known processing techniques. For example, the gate insulation layer 12 may be comprised of silicon dioxide, etc. Similarly, the gate electrode 14 may be comprised of a variety of materials such as a doped polycrystalline silicon (polysilicon). The sidewall spacer 16 may also be comprised of a variety of materials, such as, silicon dioxide, silicon nitride, silicon oxynitride, etc. The source/drain regions 18 may be formed by performing one or more ion implantation processes.

After formation of the transistors 20, a layer 24, sometimes referred to as a bottom anti-reflective coating (BARC) layer, is formed above the transistors 20 and a surface 11 of the semiconducting substrate 10. In connection with the fabrication of modem semiconductor devices, the layer 24 is typically comprised of a deposited layer of silicon nitride, silicon oxynitride, etc., that may have a thickness ranging from approximately 300–800Å. Thereafter, an insulating layer 26 is formed above the layer 24. The insulating layer 26 may be comprised of a variety of materials, such as silicon dioxide, silicon dioxide doped with boron or phosphorous, etc. The insulating layer 26 may have a thickness ranging from approximately 4000–7000Å. Next, an antireflective coating layer (ARC) 28 is then formed above the insulating layer 26. This ARC layer 28 may be formed from a variety of materials using a variety of known processing techniques. For example, the ARC layer 28 may be comprised of silicon nitride, silicon oxynitride, etc., that may have a thickness ranging from approximately 200–800Å.

Eventually, using multiple lithographic patterning and etching processes, an opening will be formed through the ARC layer 28, the insulating layer 26, and the layer 24, so that a conductive contact may be formed therein to establish electrical connection with one of the source/drain regions 18 of the transistor 20. However, such an opening must be properly aligned with the underlying transistor 20 so that it may serve its intended function. For example, if the opening was so misaligned that it was positioned over the trench isolation region 22, then the conductive contact formed therein would not serve its intended function. Fortunately, in modern semiconductor fabrication facilities such gross misalignment problems are uncommon. However, given the very small spacing between transistors in modern devices and the difficulties with patterning such small features across a large silicon wafer, misalignment of the opening for the conductive contact occurs with resulting adverse consequences to device performance.

Figure 1B:
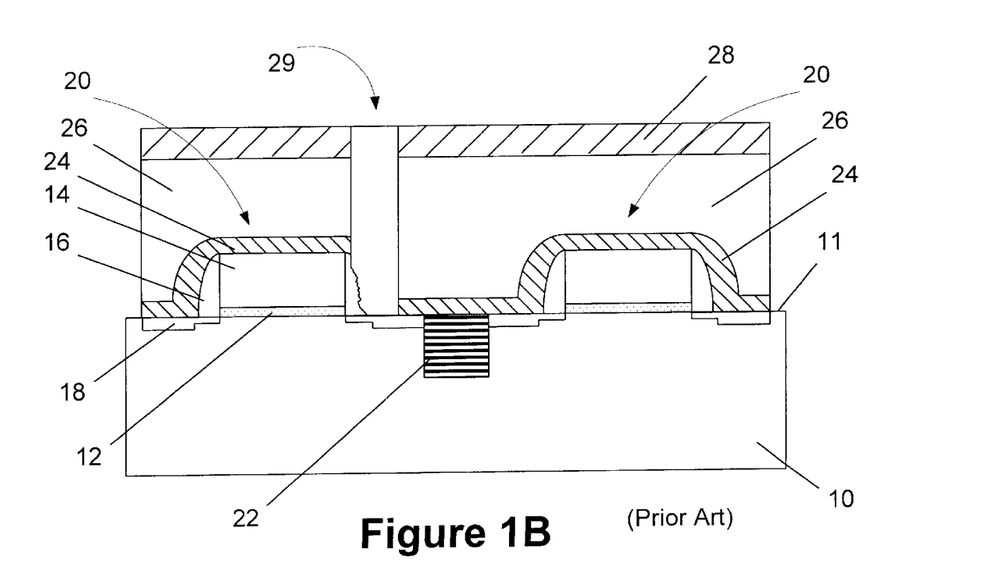

Figure 1B depicts a problem encountered in forming openings in an insulating layer for conductive contacts when there is a misalignment error. As shown therein, the opening 29 is formed in the ARC layer 28 using a patterned layer of a photoresist (not shown) as a mask. Thereafter, an etching process is performed to define the opening 29 in the insulating layer 26. During this process, it is intended that the layer 24 act as an etch stop layer with respect to the etching of the opening 29 in the insulating layer 26. Thereafter, another etching process is used to remove the portion of the layer 24 positioned beneath the opening 29 defined in the insulating layer 26.

However, in situations where the opening 29 is misaligned with respect to the transistor 20, as depicted in FIG. 1B, problems may arise when using the aforementioned prior art etching scheme and integration. In particular, although the layer 24 is designed to be an etch stop layer with respect to the etching of the opening 29 in the insulating layer 26, in practice some or all of the layer 24 may be consumed during this process. That is, the etching process used to form the opening 29 through the insulating layer 26 may, in fact, consume some or all of the layer 24 and the sidewalls spacer 16 positioned adjacent the gate electrode 14, as indicated in FIG. 1B.

In such situations, device performance may be impaired, in that leakage currents may be increased and/or short circuit paths may be established between the gate electrode 14 and the source/drain region 18. Thus, while it is desirable to avoid misalignment of the contact opening 29 with respect to the underlying transistor 20, is also desirable to have a contact etch scheme that solves, or at least reduces, some or all of the aforementioned problems when misalignment of the contact opening 29 does occur.

The present invention is directed to a method that solves, or at least reduces, some or all of the aforementioned problems.

SUMMARY OF THE INVENTION

The present invention is directed to a method of forming a conductive contact on an integrated circuit device. In one illustrative embodiment, the method comprises forming a transistor above a semiconducting substrate, and forming a first layer comprised of an orthosilicate glass (OSG) material above the transistor and the substrate. The method further comprises forming a second layer comprised of an insulating material above the first layer, and performing at least one etching process to define an opening in the second layer for a conductive contact to be formed therein, wherein the first layer comprised of an orthosilicate glass material acts as an etch stop layer during the etching of the opening in the second layer. In another illustrative embodiment, the method further comprises forming a third layer comprised of an orthosilicate glass material above the insulating layer prior to forming the opening in the insulating layer, and performing at least one etching process to define an opening in the first layer and to remove substantially all of the third layer from above the insulating layer.

In another aspect, the present invention is directed to an integrated circuit device comprised a plurality of transistors formed above a semiconducting substrate, and an etch stop layer comprised of an orthosilicate glass material positioned above the transistors and the substrate. The device further comprises a layer of insulating material positioned above the etch stop layer, and a conductive contract positioned in an opening formed in the insulating layer and in the etch stop layer.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2A–2J. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and regions depicted in the drawings may be exaggerated or reduced as compared to the size of those features or regions on fabricated devices. Nevertheless, the attached drawings are included to describe and explain illustrative examples of the present invention.

In general, the present invention is directed to an etch for scheme for forming contact openings in an insulating layer. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc. Moreover, the present invention may be used with a variety of combinations of materials for the insulating layer, the top and bottom anti-reflecting coating layers, and the conductive materials used to form the conductive interconnections.

Figure 2A:
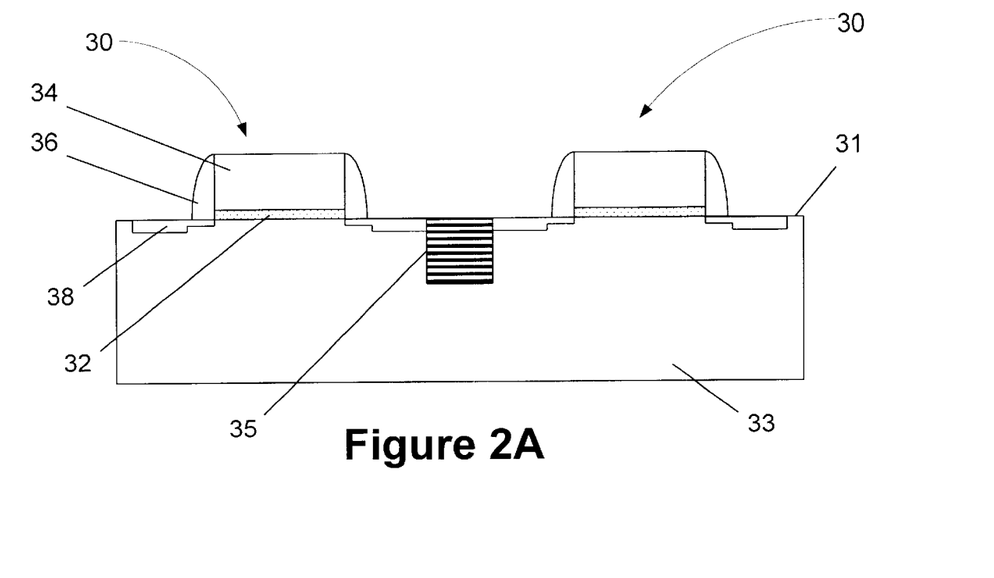
FIGS. 2A–2J depict one illustrative embodiment of the inventive methods disclosed herein.

As shown in FIG. 2A, a plurality of transistors 30, having a trench isolation region 35 positioned therebetween, are formed above a semiconducting substrate 33. In the illustrative embodiment depicted in FIG. 2A, the transistors 30 are NMOS transistors. However, those skilled in the art will recognize that the transistors 30 could also be PMOS or CMOS type devices. Each transistor 30 is comprised of a gate insulation layer 32, a gate electrode 34, a sidewall spacer 36, and a plurality of source/drain regions 38. The materials comprising the various components of the transistors 30, as well as the manner in which those components are formed, are well-known to those skilled in the art. For example, the gate insulation layer 32 may be comprised of silicon oxide, the gate electrode 34 may be comprised of polysilicon, the sidewalls spacer 36 may be comprised of silicon dioxide, and the source/drain regions 38 may be formed by performing one or more ion implantation processes. Thus, the materials of construction for the various components of the illustrative transistors 30 depicted in FIG. 2A, as well as the particular processes used to form such components, should not be considered a limitation of the present invention unless specifically set forth in the appended claims.

Figure 2B:
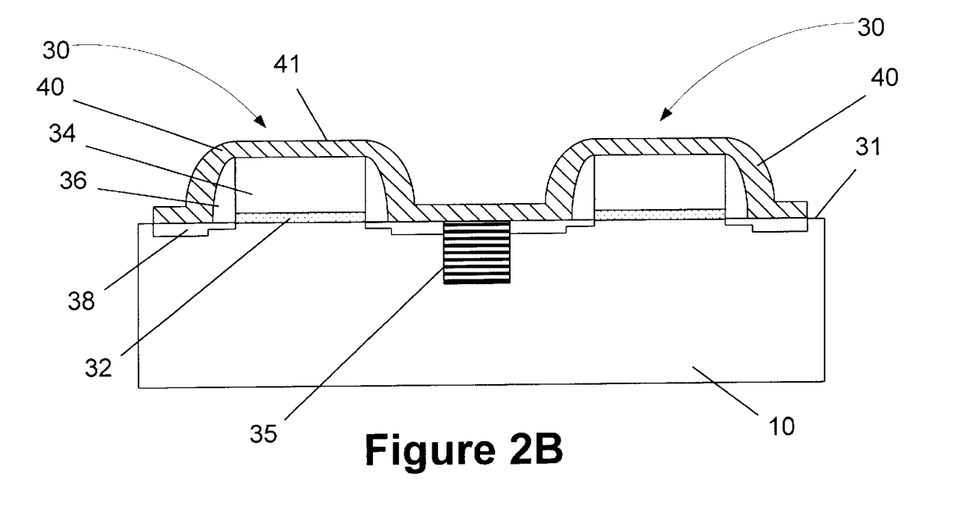

Next, as shown in FIG. 2B, a first layer 40, sometimes referred to as a bottom antireflective coating (BARC) layer, is formed above the transistors 30 and the surface 31 of the semiconducting substrate 33. In the illustrative embodiment described herein, the first layer 40 is comprised of an orthosilicate glass (OSG) material having a thickness ranging between approximately 200–800Å. The layer 40 may be formed by a variety of processing techniques such as a chemical vapor deposition (CVD), plasma enhanced chemical vapor deposition (PECVD), spin-coating, etc. Commercially available materials that may be employed as the layer 40 include products known as Black Diamond® or Coral®, products that are sold by Applied Materials and Novellus, respectively.

Figure 2C:
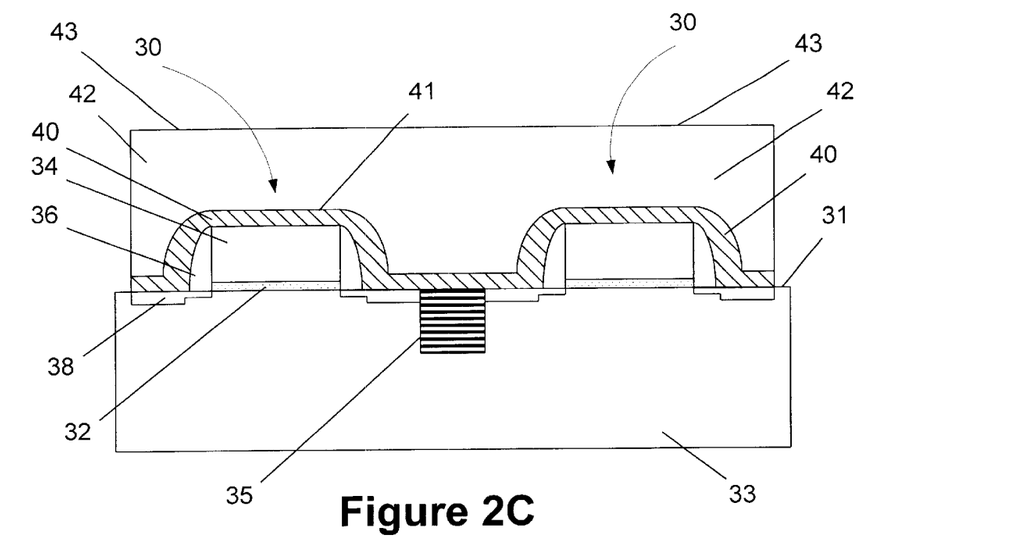

Thereafter, as shown in FIG. 2C, an insulating layer 42 is then formed above a surface 41 of the layer 40. The insulating layer 42 may be comprised of a variety of insulating materials, e.g., an oxide, silicon dioxide, boron or phosphorous doped oxides, a fluorinated oxide, or any other material sufficient for serving its insulative purpose. The insulating layer 42 may be formed by a variety of techniques, such as chemical vapor deposition ("CVD"), low pressure chemical vapor deposition ("LPCVD"), physical vapor deposition ("PVD"), sputtering, thermal growing, etc. Moreover, the insulating layer 42 may have a variety of thicknesses. In one illustrative embodiment, the insulating layer 42 is comprised of a deposited layer of silicon dioxide having a thickness ranging from approximately 4000–7000Å. Thus, the particular materials of construction of the insulating layer 42, and the manner in which it is made, should not be considered a limitation of the present invention unless specifically set forth in the appended claims.

Figure 2D:
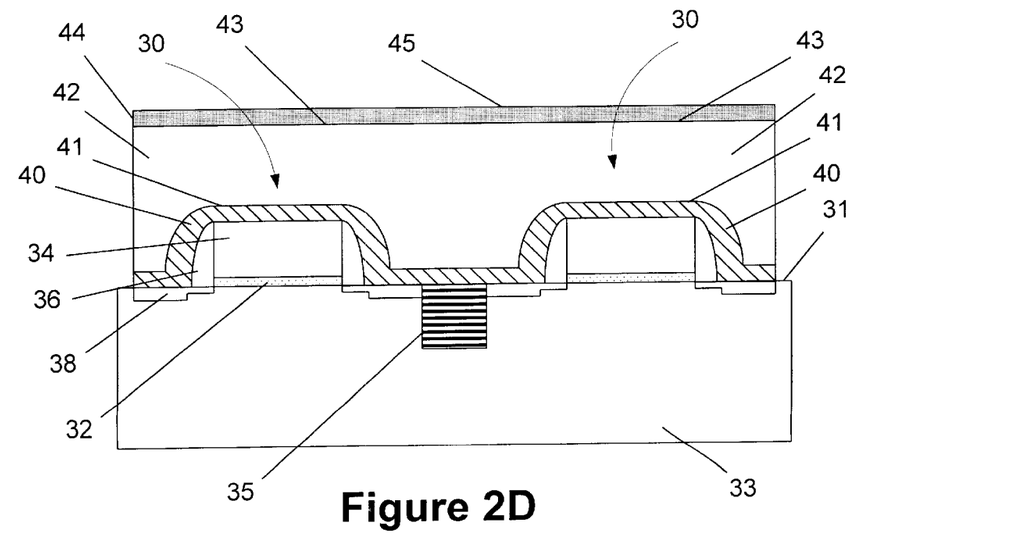

Next, as indicated in FIG. 2D, an antireflective coating (ARC) layer 44 is formed above the surface 43 of the insulating layer 42. The purpose of the ARC layer 44 is to reduce reflections encountered in subsequent photolithography operations used to form an opening in the insulating layer 42. The ARC layer 44 may be comprised of a variety of materials, such as silicon nitride, silicon oxynitride, etc., and it may be formed to a variety of thicknesses. For example, in one illustrative embodiment, the ARC layer 44 may be comprised of a deposited layer of silicon nitride having a thickness ranging from approximately 300–800Å. In another illustrative embodiment of the present invention, the ARC layer 44 may be comprised of an orthosilicate glass (OSG) material similar to that of the layer 40 described above. For example, in one illustrative embodiment the ARC layer 44 may be comprised of a deposited layer of Black Diamond® or Coral® material having a thickness ranging from approximately 300–800 Å.

Figure 2E:
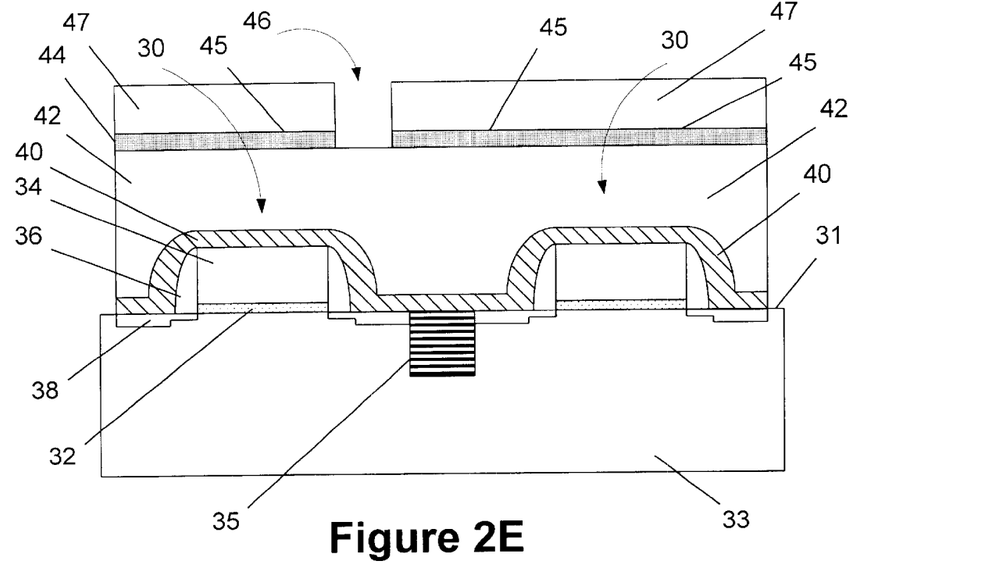
Figure 2F:
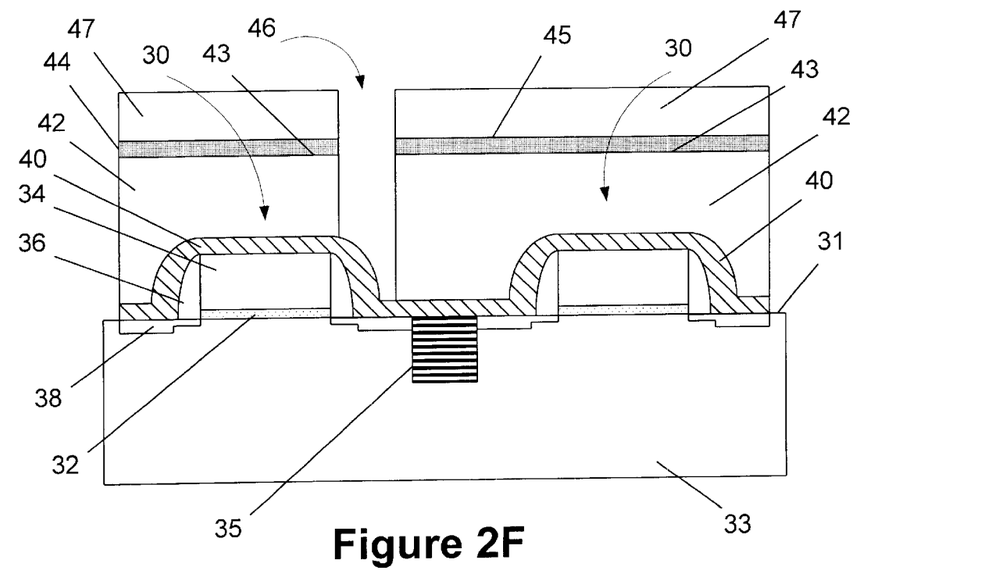

Next, as indicated in FIG. 2E, a patterned layer of photoresist 47 is formed above a surface 45 of the ARC layer 44 using known photolithography processing techniques. Thereafter, an opening 46 is formed in the ARC layer 44 using an etching process that is generally selective with respect to the material comprising the insulating layer 42. Next, as indicated in FIG. 2F, another etching process is performed to define the opening 46 within the insulating layer 42. The etching of the insulating layer 46 may be performed in the same etch chamber or process tool as was the etching process performed to pattern the ARC layer 44, or may be performed in an entirely separate etching chamber.

Note that during this process of forming the opening 46 in the insulating layer 42, the layer 40, comprised of an orthosilicate glass (OSG) material, acts as an effective etch stop layer to prohibit, or substantially reduce, penetration of the layer 40 by the etching process used to form the opening 46 in the insulating layer 42. That is, the etch stop layer 40 acts to prevent or reduce consumption of the sidewall spacer 36 when the opening 46 is being formed in the insulating layer 42. The orthosilicate glass material that comprises the layer 40 etches at a much slower rate than that of, for example, silicon dioxide. By way of example, the Black Diamonds® material described above may etch at a rate that is approximately 50–200% percent slower than that of a deposited layer of silicon dioxide. The orthosilicate glass material also exhibits differential etch rates with respect to other commonly encountered insulating materials, such as silicon oxynitride, fluorinated oxides, etc.

Figure 2G:
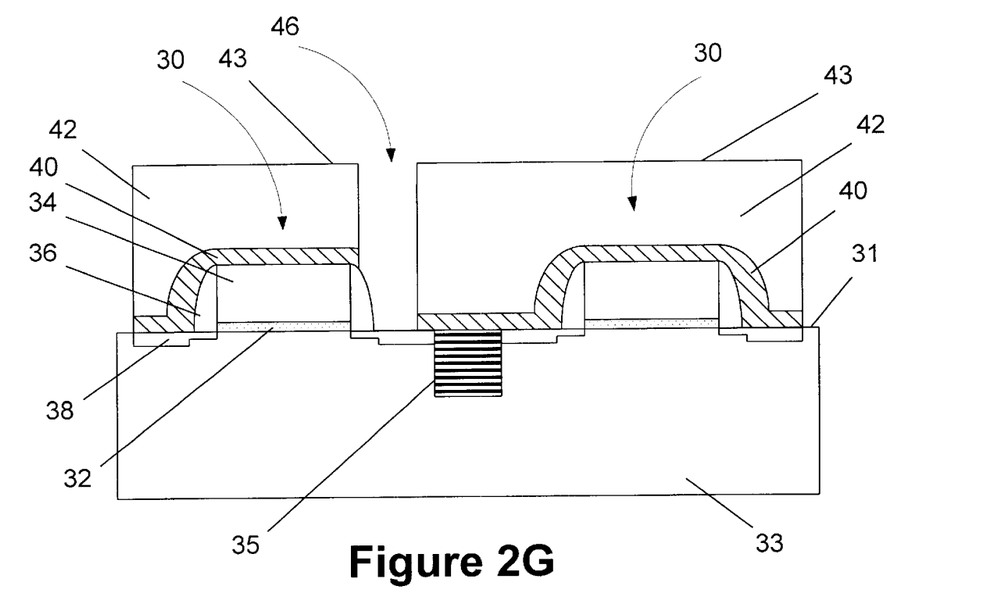

Then, as indicated in FIG. 2G, another etching process is performed to pattern the layer 40 such that conductive interconnection may be established with the underlying source/drain region 38. This etching process is selective to the materials comprising the insulating layer 42 and the sidewall spacer 36. For example, where the insulating layer 42 and the sidewall spacer 36 are comprised of silicon dioxide, the removal of the layer 40 in the area defined by the opening 46 may be accomplished using a fluorine-based plasma etching process.

In one particularly illustrative embodiment where the layer 40 and the ARC layer 44 are comprised of orthosilicate glass materials, the ARC layer 44 may also be removed during the process of removing portions of the layer 40. This situation is depicted in FIG. 2G. This is beneficial in that, by removing the ARC layer 44, the aspect ratio of the opening 46, i.e., the ratio of the opening depth to opening width, may be reduced, thereby enhancing the ability to fill the opening 46 with a conductive material. That is, by reducing the aspect ratio of the opening 46, the ability to form a conductive contact that is free of voids or other defects is increased relative to forming such conductive contacts in openings having higher aspect ratios.

However, it should be understood that, in order to practice one aspect of the present invention, it is not required that the ARC layer 44 be comprised of the same type of material as that of the layer 40. Moreover, even in situations where the layer 40 and the ARC layer 44 are comprised of the same type of material, it is not required that both of the layers be removed during the same etching process. Thus, the particular relationship between the layer 40 and the ARC layer 44 as it relates to their materials of construction or when all or portions of the layers are removed, should not be considered a limitation of the present invention unless such limitations are specifically set forth in the appended claims.

Figure 2H:
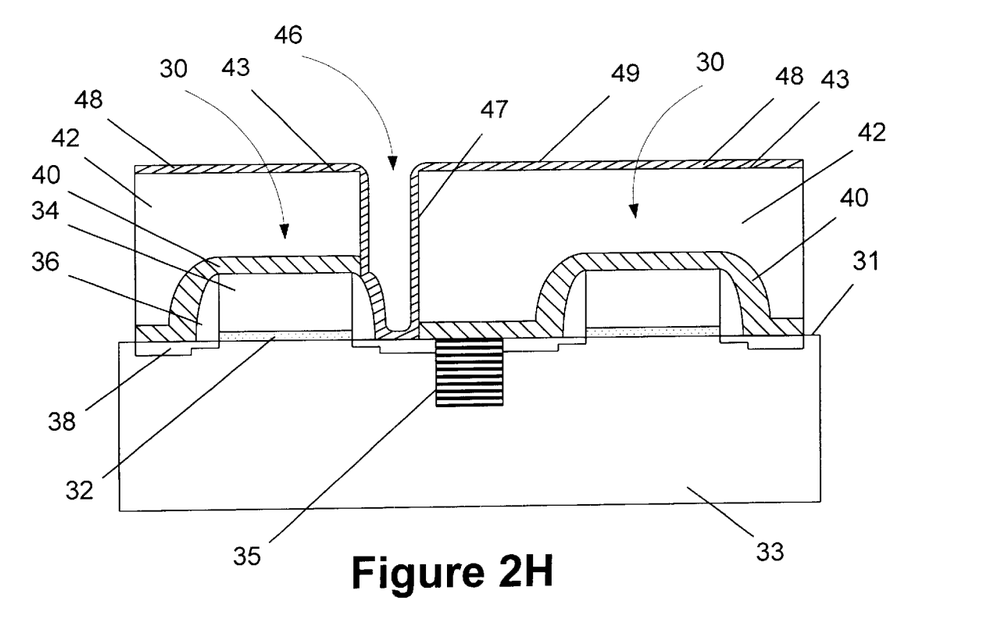

As shown in FIG. 2H, a barrier layer 48 is then formed above a surface 43 of the insulating layer 42 and in the opening 46. Again, this particular embodiment depicts the situation where the layer 40 and the ARC layer 44 are comprised of an orthosilicate glass (OSG) material, and wherein the ARC layer 44 has been removed during the process of removing portions of the layer 40 positioned beneath the opening 46. This barrier layer 48 may be formed by a variety of processing techniques and it may be comprised of a variety of materials. For example, the barrier layer 48 may be conformally deposited above the surface 43 of the insulating layer 42 and in the opening 46. It may be formed by a variety of process, e.g., PVD, LPCVD, CVD, etc. The barrier layer 48 also substantially covers sidewalls 47 of the opening 46, as shown in FIG. 2H. The barrier layer 48 may be formed from a variety of materials, e.g., tantalum, tungsten nitride, titanium nitride, tantalum nitride, etc. In certain situations, although not depicted in FIG. 2H, the barrier layer 48 may actually be comprised of a bi-layer combination of materials, e.g., a titanium/titanium nitride bi-layer. The thickness of the barrier layer 48, as well as the manner in which it is formed, are matters of design choice. For example, in situations where the barrier layer 48 is comprised of titanium nitride, it may have a thickness ranging from approximately 100–500Å, and it may be formed by a PVD process. In view of the foregoing, it is readily apparent that the thickness, the materials of construction, and the manner in which the barrier layer 48 is formed, should not be considered a limitation of the present invention unless specifically recited in the appended claims.

Figure 2I:
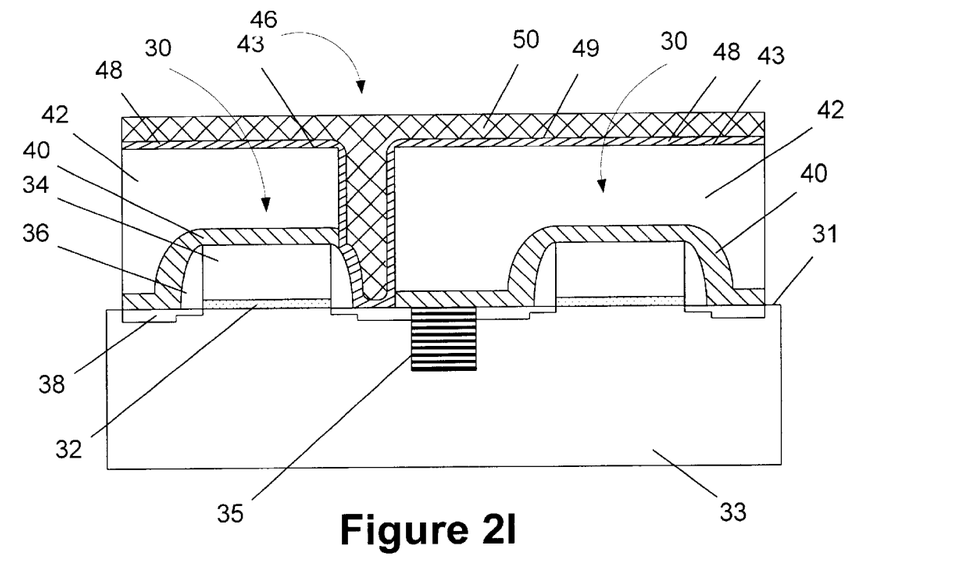

Next, as shown in FIG. 2I, a layer of conductive material 50 is formed above a surface 49 of the barrier layer 48 and in the opening 46. The conductive material 50 may be comprised of a variety of materials, e.g., tungsten, aluminum, copper, etc. and it may be directly deposited above the surface 49 of the barrier layer 48 and in the opening 46. Such a layer may be formed by a variety of known processes, e.g., CVD, LPCVD, PVD, etc.

Figure 2J:
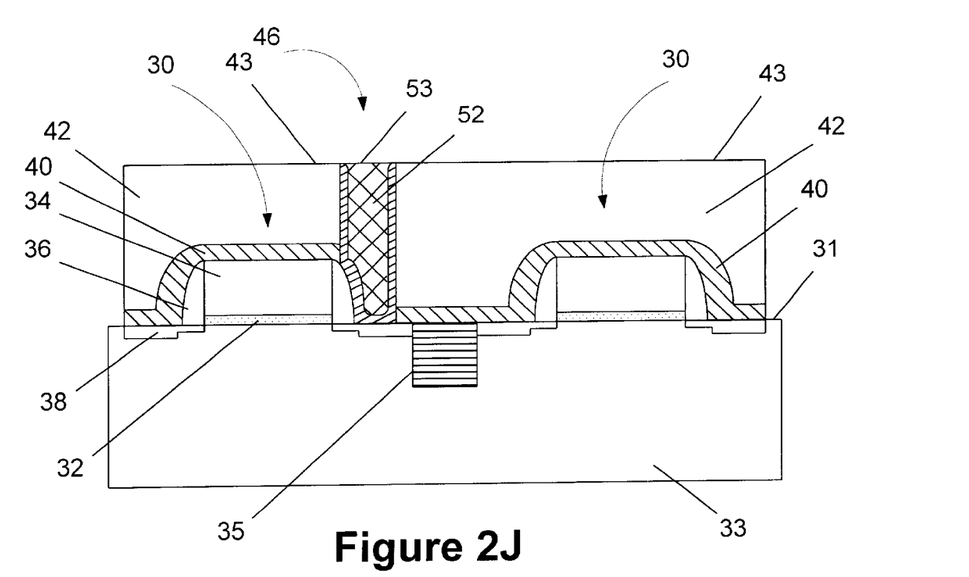

Thereafter, one or more chemical mechanical polishing ("CMP") operations are performed to remove portions of the conductive layer 50 and the barrier layer 48 lying outside of the opening 46 above the surface 43 of the insulating layer 42 to define a conductive contact 52, as shown in FIG. 2J. That is, CMP operations are performed until such time that substantially all of the conductive material, e.g., tungsten, aluminum, is removed from above the surface 43 of the insulating layer 44. When CMP operations are completed, a surface 53 of the conductive contact 52 is approximately planar with the surface 43 of the insulating layer 42.

The present invention is generally directed to a method of forming conductive interconnections in an integrated circuit device. In one illustrative embodiment, the method comprises forming a transistor 30 above a semiconducting substrate, and forming a first layer 40 comprised of an orthosilicate glass material above the transistor 30 and the substrate 33. The method further comprises forming a second layer 42 comprised of an insulating material above the first layer 40, and performing at least one etching process to define an opening 46 in the second layer 42 for a conductive contact to be formed therein, wherein the first layer 40 comprised of an orthosilicate glass material acts as an etch stop layer during the etching of the opening 46 in the second layer 42. In another, illustrative embodiment, the method disclosed herein further comprises forming a third layer 44 comprised of an orthosilicate glass material above the second layer 42 prior to forming the opening 46 in the second layer 42, and performing at least one etching process to define an opening 46 in the first layer 40 and to remove substantially all of the third layer 44 from above the second layer 42.

The present invention is also directed to a novel integrated circuit device. In one illustrative embodiment, the device is comprised of a plurality of transistors 30 formed above a semiconductor substrate 33, and an etch stop layer 40 comprised of an orthosilicate glass material (OSG) positioned above the transistor 30 and the substrate 33. The device further comprises a layer of insulating material 42 positioned above the etch stop layer 24, and a conductive contact positioned in an opening formed in the insulating layer 42 and in the etch stop layer 40.

The particular embodiments disclosed above are illustrative only, as the invention may be modified and practiced in different by equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a transistor above a semiconducting substrate;
   forming a first layer comprised of at least one of Black Diamond® and Coral® material above said transistor and said substrate;
   forming a second layer comprised of an insulating material above said first layer; and
   performing at least one etching process to define an opening in said second layer for a conductive contact to be formed therein, wherein said first layer acts as an etch stop layer during the etching of the opening in the second layer.

2. The method of claim 1, wherein forming a transistor above a semiconducting substrate comprises forming a transistor comprised of a gate insulation layer, a gate electrode, a sidewall spacer and a plurality of source/drain regions above a semiconducting substrate.

3. The method of claim 1, wherein forming a first layer comprised of at least one of Black Diamond® and Coral® material above said transistor and said substrate comprises depositing a first layer comprised of at least one of Black Diamond® and Coral® material having a thickness ranging from approximately 300–800 Å.

4. The method of claim 1, wherein forming a first layer comprised of at least one of Black Diamond® and Coral® material above said transistor and said substrate comprises depositing a first layer comprised of at least one of Black Diamond® and Coral® material above said transistor and said substrate.

5. The method of claim 1, wherein forming a second layer comprised of an insulating material above said first layer comprises forming a second layer comprised of silicon dioxide, boron or phosphorous doped oxide, or fluorinated oxide above said first layer.

6. The method of claim 1, wherein forming a second layer comprised of an insulating material above said first layer comprises depositing a second layer comprised of an insulating material above said first layer.

7. The method of claim 1, wherein forming a second layer comprised of an insulating material above said first layer comprises depositing a second layer comprised of silicon dioxide having a thickness ranging from approximately 3000–7000 Å.

8. The method of claim 1, further comprising:
   forming an opening in said first layer;
   forming a barrier layer in at least said opening in said second layer;
   depositing a conductive material above said barrier layer and in said opening in said second layer; and
   performing at least one chemical mechanical polishing operation to define a conductive contact in said opening in said first layer.

9. The method of claim 1, further comprises:
   forming a third layer above said second layer prior to forming an opening in said second layer, said third layer comprised of at least one of silicon nitride, silicon oxynitride, and an orthosilicate glass material.

10. The method of claim 1, further comprises:
    forming a third layer comprises of an orthosilicate glass material above said second layer prior to forming said opening in said second layer; and
    performing at least one etching process to define an opening in said first layer and to remove substantially all of said third layer from above said second layer.

11. A method of claim 10 further comprises:
    forming a barrier layer comprised of at least one of tungsten nitride, titanium nitride, tantalum nitride and a titanium/titanium nitride bi-layer on a surface of said second layer and in said opening in said second layer.

12. The method of claim 8, wherein forming said barrier layer comprises forming said barrier layer from at least one of tungsten nitride, titanium nitride, tantalum nitride and a titanium/titanium nitride bi-layer.

13. The method of claim 8 wherein depositing said conductive material comprises depositing at least one of tungsten, aluminum and copper.

14. The method of claim 10 wherein forming said third layer comprises forming said third layer using Black Diamond® or Coral® material.

15. The method of claim 10 wherein forming said third layer comprises forming said third layer having a thickness ranging from approximately 200–800 Å.

16. A method, comprising:
   forming a transistor above a semiconducting substrate;
   forming a first layer comprised of at least one of Black Diamond® and Coral® material above said transistor and said substrate;
   forming a second layer comprised of an insulating material above said first layer;
   forming a third layer comprised of an orthosilicate glass material above said second layer;
   performing a first etching process to define an opening in said third layer;
   performing a second etching process to define an opening in said second layer under said opening in said third layer wherein said first layer acts as an etch stop layer during said etching of the opening in the second layer; and
   performing at least a third etching process to define an opening in said first layer under said opening in said second layer and to remove substantially all of said third layer from above said second layer.

17. The method of claim 16, wherein forming a transistor above a semiconducting substrate comprises forming a transistor comprised of a gate insulation layer, a gate electrode, a sidewall spacer and a plurality of source/drain regions above a semiconducting substrate.

18. The method of claim 16, wherein forming a first layer comprised of at least one of Black Diamond® and Coral® material above said transistor and said substrate comprises depositing a first layer comprised of at least one of Black Diamond® and Coral® material having a thickness ranging from approximately 300–800 Å.

19. The method of claim 16, wherein forming a first layer comprised of at least one of Black Diamond® and Coral® material above said transistor and said substrate comprises depositing a first layer comprised of at least one of Black Diamond® and Coral® material above said transistor and said substrate.

20. The method of claim 16, wherein forming a second layer comprised of an insulating material above said first layer comprises forming a second layer comprised of silicon dioxide, silicon oxynitride or fluorinated oxide.

21. The method of claim 16, wherein forming a second layer comprised of an insulating material above said first layer comprises depositing a second layer comprised of an insulating material above said first layer.

22. The method of claim 16, wherein forming a second layer comprised of an insulating material above said first layer comprises depositing a second layer comprised of silicon dioxide having a thickness ranging from approximately 3000–7000 Å.

23. The method of claim 16, further comprises:
   forming a barrier layer in at least said opening in said second layer;
   depositing a conductive material above said barrier layer and in said opening in said second layer; and
   performing at least one chemical mechanical polishing operation to define a conductive contact in said opening in said second layer.

24. The method of claim 23, wherein said barrier layer is comprised of at least one of tungsten nitride, titanium nitride, tantalum nitride and a titanium/titanium nitride bi-layer.

25. The method of claim 23 wherein said conductive material is comprised of at least one of tungsten, aluminum and copper.

26. The method of claim 16 wherein said third layer is comprised of at least one of Black Diamond® and Coral® material.

27. The method of claim 16, wherein said third layer has a thickness ranging from approximately 200–800 Å.

28. The method of claim 16, wherein forming a third layer comprised of at least one of Black Diamond® and Coral® material above said second layer comprises depositing a third layer comprised of at least one of Black Diamond® and Coral® material above said second layer.

29. The method of claim 16, wherein performing at least a third etching process comprises performing at least one oxygen plasma etching process.

30. A method, comprising:
   forming a transistor above a semiconducting substrate;
   depositing a first layer comprised of at least one of Black Diamond® and Coral® material having a thickness ranging from approximately 300–800 Å above said transistor and said substrate;
   depositing a second layer comprised of an insulating material above said first layer;
   depositing a third layer comprised of at least one of Black Diamond® and Coral® material having a thickness ranging from approximately 300–800 Å above said second layer;
   performing a first etching process to define an opening in said third layer;
   performing a second etching process to define an opening in said second layer under said opening in said third layer, wherein said first layer acts as an etch stop opening during said etching of the opening in the second layer; and
   performing at least a third etching process to define an opening in said first layer under said opening and in said second layer and to remove substantially all of said third layer from above said second layer.

31. The method of claim 30, wherein forming a transistor above a semiconducting substrate comprises forming a transistor comprised of a gate insulation layer, a gate electrode, a sidewall spacer and a plurality of source/drain regions above a semiconducting substrate.

32. The method of claim 30, wherein depositing a second layer comprised of an insulating material above said first layer comprises depositing a second layer comprised of silicon dioxide, silicon oxynitride or fluorinated oxide.

33. The method of claim 30, wherein depositing a second layer comprised of an insulating material above said first layer comprises depositing a second layer comprised of silicon dioxide having a thickness ranging from approximately 3000–7000 Å.

34. The method of claim 30, further comprises:
   forming a barrier layer in at least said opening in said second layer and on a surface of said second layer;
   depositing a conductive material above said barrier layer and in said opening in said second layer; and
   performing at least one chemical mechanical polishing operation to define a conductive contact in said opening in said second layer.

35. The method of claim 34, wherein said barrier layer is comprised of at least one of tungsten nitride, titanium nitride, tantalum nitride and a titanium/titanium nitride bi-layer.

36. The method of claim 34, wherein said conductive material is comprised of at least one of tungsten, aluminum and copper.

* * * * *

UNITED STATES PATENT AND TRADEMARK OFFICE
CERTIFICATE OF CORRECTION

PATENT NO. : 6,413,846 B1
DATED : July 2, 2002
INVENTOR(S) : Paul R. Besser, Errol Todd Ryan, Frederick N. Hause, Frank Mauersberger, William S. Brennan, John A. Iacoponi and Peter J. Beckage It is certified that error appears in the above-identified patent and that said Letters Patent is hereby corrected as shown below:

<u>Title page,</u>
Item [54], Title, delete "EACH" and insert therefor -- ETCH --.

Signed and Sealed this

Twentieth Day of August, 2002

Attest:

Attesting Officer

JAMES E. ROGAN
*Director of the United States Patent and Trademark Office*